United States Patent
Yang

(10) Patent No.: US 11,143,712 B2
(45) Date of Patent: Oct. 12, 2021

(54) ZERO-SEQUENCE PARAMETER MEASUREMENT AND GROUND VOLTAGE CONTROL METHOD FOR RESONANT GROUND SYSTEM BASED ON VIRTUAL GROUND PRINCIPLE

(71) Applicant: HANGZHOU QIUCHUANG ELECTRIC POWER SCIENCE & TECHNOLOGY CO., LTD., Hangzhou (CN)

(72) Inventor: Guiyu Yang, Hangzhou (CN)

(73) Assignee: HANGZHOU QIUCHUANG ELECTRIC POWER SCIENCE & TECHNOLOGY CO., LTD., Hangzhou (CN)

( * ) Notice: Subject to any disclaimer, the term of this patent is extended or adjusted under 35 U.S.C. 154(b) by 85 days.

(21) Appl. No.: 16/673,993

(22) Filed: Nov. 5, 2019

(65) Prior Publication Data

US 2020/0150191 A1    May 14, 2020

(30) Foreign Application Priority Data

Nov. 8, 2018  (CN) .......................... 201811326809.8

(51) Int. Cl.
  *G06F 11/30*   (2006.01)
  *G01R 31/52*   (2020.01)
  (Continued)

(52) U.S. Cl.
  CPC ......... *G01R 31/52* (2020.01); *G01R 19/2513* (2013.01); *H02J 3/00* (2013.01); *H02J 2203/20* (2020.01)

(58) Field of Classification Search
  CPC ..................................................... G01R 31/52
  See application file for complete search history.

(56) References Cited

U.S. PATENT DOCUMENTS

2018/0128867 A1*  5/2018  Zhang ................ G01R 31/3274
2018/0306853 A1* 10/2018  Kell ...................... H02H 7/1216

FOREIGN PATENT DOCUMENTS

CN       201478828 U    5/2010
CN       104065059 A    9/2014
(Continued)

OTHER PUBLICATIONS

First Office Action(201811326809.8); dated Aug. 4, 2020.

*Primary Examiner* — Phuong Huynh
(74) *Attorney, Agent, or Firm* — W&G Law Group

(57) ABSTRACT

The present disclosure provides a zero-sequence parameter measurement and ground voltage control method for a resonant ground system based on a virtual ground principle. The method, based on the virtual ground principle, arbitrarily specifies a point K in a phasor plane in which three-phase voltages are located. A virtual ground control method is used to achieve virtual ground of the point K, and an accurate zero-sequence resonant parameter of a zero-sequence network under an action of the excitation $\dot{U}_{KN}$ can be obtained. When a single-phase ground fault occurs, a ground phase is specified as a target working point, and a control method is applied to cause the zero-sequence network to accurately resonate, and a voltage of this phase relative to ground is 0. At this time, both a residual voltage and a residual current of the fault phase are effectively suppressed.

5 Claims, 4 Drawing Sheets

(51) Int. Cl.
*G01R 19/25* (2006.01)
*H02J 3/00* (2006.01)

(56) References Cited

FOREIGN PATENT DOCUMENTS

| | | |
|---|---|---|
| CN | 104901299 A | 9/2015 |
| CN | 107064733 A | 8/2017 |
| JP | 3161757 B2 | 4/2001 |
| WO | 2008046309 A1 | 4/2008 |

* cited by examiner

ZERO-SEQUENCE PARAMETER MEASUREMENT AND GROUND VOLTAGE CONTROL METHOD FOR RESONANT GROUND SYSTEM BASED ON VIRTUAL GROUND PRINCIPLE

TECHNICAL FIELD

The present disclosure relates to a zero-sequence parameter measurement and ground voltage control method for a resonant ground system based on a virtual ground principle, and in particular, to an on-line accurate measurement method for zero-sequence parameters of a resonant ground system and a method for controlling a voltage of a single-phase ground (including virtual ground) fault relative to ground, which can achieve effect of high-precision measurement and low residual voltage control, and the virtual ground principle is universal.

BACKGROUND

The key to a resonant ground system lies in that a reactance current flowing through a neutral point must be exactly equal to a distributed capacitive current of the three-phase relative to ground, such that the arc-suppression reactance and the line distributed capacitance are in parallel resonance to achieve the lowest fault phase-to-ground voltage, which is 0 volts theoretically. Being affected by changes in operating conditions of a power distribution network, the line distributed capacitance and conductance parameters usually change, and it is difficult to measure accurately, so it is impossible to accurately set parameters of an arc-suppression reactor in advance. For arc-suppression devices such as a preadjusted turn reactance, a preset parameter phase-controlled reactance, a preset parameter capacity and tune regulating reactance, etc., there are precision problems of preset parameters, i.e., the measurement deviation of a zero-sequence capacitance causes an actual working point to shift. However, the active consumption caused by line conductance, coil internal resistance, ground resistance, etc., will result in greater control deviation, which cannot be compensated by the arc-suppression reactance. Therefore, after the arc-suppression device operates, there is always a certain residual voltage and a ground residual current at the fault phase ground point relative to the ground.

The existing control scheme inherits characteristics of the LC resonance of the zero-sequence circuit, and develops in several aspects such as accurate measurement about the zero-sequence parameters, accurate adjustment of the arc-suppression reactance, accurate measurement and compensation of an active component, etc. However, these aspects are basically implemented separately, and in particular, there is a lack of effective correlation between measurement behavior and arc-suppression behavior, with the former being not accurate and the latter being not in place. Thus, a perfect solution, which integrates and broadens the existing theory, establishes an integrated arc-suppression system for measurement and control, effectively solves the problem of active component compensation, accurate resonance and residual voltage residual current limitation in an arc-suppression state, is still needed.

SUMMARY

The object of the present disclosure is to provide a zero-sequence parameter measurement and ground voltage control method for a resonant ground system based on a virtual ground principle, in view of the deficiencies of the related art.

The present disclosure proposes: arbitrarily specifying a point K in a phasor plane in which three-phase voltages are located, a voltage relative to a neutral point N being $\dot{U}_{KN}$, using a ground point voltage zeroing control scheme, the zero-sequence network being the accurate resonance under an action of $\dot{U}_{KN}$, causing a voltage of the specified point K relative to ground to be 0, i.e., equivalent to that the point K being grounded, which is here named virtual ground. In particular, if the specified point K coincides with a line voltage phasor of any phase, this phase is grounded, which is equivalent to the fault ground condition in an existing system. The virtual ground method does not require the point K to apply a transition impedance to ground, and does not even need to be physically visible, and is valid for the entire phasor plane.

i) According to the virtual ground principle, when an effective value and a phase of the voltage $\dot{U}_{KN}$ of the specified point K are exact values, virtual ground is achieved, and accurate zero-order resonant parameters of the zero-sequence network under an action of the excitation source $\dot{U}_{KN}$ can be obtained. During the measurement, the neutral point compensation current is proportional to $\dot{U}_{KN}$. If the zero-sequence parameters have sufficient measurement precision and have no effect on system insulation under the applied $\dot{U}_{KN}$ excitation amplitude, it can be used as an appropriate online measurement method for zero-sequence parameters. The obtained parameters are the zero-sequence network parameters of the power distribution network after being equivalent according to the positive and negative zero, and the actual symmetry of the power distribution network is no longer considered.

ii) When the fault phase is grounded, the ground phase voltage can be specified as the target working point, and a virtual ground control is applied as described above to cause the zero-sequence network to accurately resonate, and the voltage of this phase relative to ground is zero. At this time, both the residual voltage and the residual current of the fault phase are effectively suppressed. The accurate measurement results in i) can be used for the pre-tuning control of the arc-suppression reactance, and the virtual ground can be used for the accurate compensation of the inductive current difference, which can reduce the controlled source capacity and save the overall cost of the device. For the cost increase, the virtual ground controlled-source with full compensation capability is provided, and online measurement and arc-suppression reactance pre-tuning control are not required.

iii) Effectively selecting the virtual ground point can achieves an increase of the specified phase-to-ground voltage, for probing this phase insulation while the insulation of the other two phases relative to ground are not affected.

iv) Specifying a voltage of a small magnitude near the neutral point N as a virtual ground clamping can effectively suppress the excited oscillation of the line voltage.

Specifically, the virtual ground control method of the present disclosure is as follows:

using a conventional resonant ground manner, the neutral point N being grounded via a series branch of an arc-suppression inductance L, an equivalent resistance R and a controllable inverter source unit $\dot{U}_x$, an injection current of the branch being $\dot{I}_x$; taking a fraction $L_0/m$ of a standard arc-suppression reactance $L_0$ as an injection branch reactance L, and $L_0, C_0$ satisfying a resonant condition:

$$\omega^2 L_0 C_0 = 1$$

then:

$$\dot{U}_x = \left(1 - \frac{1}{m}\right)\dot{U}_{KN} + j\omega C_0 R \dot{U}_{KN} + (R + j\omega L)Y_0 \dot{U}_{KN}$$

wherein $\dot{U}_{KN}$ is a voltage of the specified point K relative to the neutral point N, $C_0$ is a total zero-sequence capacitance and is a sum of a distributed capacitance of the three phases, $Y_0$ is a total zero-sequence conductance and is a sum of a distributed conductance of the three phases, ω is a power frequency angular frequency of a power distribution network; and taking a virtual working point K-to-ground voltage $\dot{U}_{KG}$ as an input and taking a ground-to-neutral point N voltage $\dot{U}_{GN}$ and a voltage drop of the system zero-sequence network current on the injection branch as corrections to construct a negative feedback control loop, taking an appropriate complex phasor proportional integral parameter cPI $[K_p+K_i/s]$, causing the zero-sequence circuit to enter into an LC parallel resonant state, and the loop circuit input $U_{KG}$ converging to 0, PI control calculation being applied to both a real part and an imaginary part of the input complex phasor, a governing equation being as follows:

$$\dot{U}_x = \dot{U}_{GN} + (R+j\omega L)(\dot{I}_{C0}+\dot{I}_{Y0}) + cPI[\dot{U}_{KG}(R+j\omega L)/R_k]$$

wherein the complex phasor proportional integral part is:

$$cPI[a+jb]=a(K_p+K_i/s)+jb(K_p+K_i/s)$$

$R_K$ is a virtual working point-to-ground transition resistance, and $\dot{I}_{C0}+\dot{I}_{Y0}$ is a line zero-sequence total current and is a complex constant under a resonance convergence condition.

In the above aspect, two parameters of the line zero-sequence total current $\dot{I}_{C0}+\dot{I}_{Y0}$ and the impedance $R_k$ are ignored, and the governing equation is simplified as:

$$\dot{U}_x = cPI[\dot{U}_{KG}]$$

In the method of the present disclosure, when the controlled voltage source is injected into the neutral point of the system via the reactance, the injection can be performed in a direct-hanging mode, i.e., a compensation inductive current is injected directly into the neutral point, or a compensation current is injected into the neutral point by using an isolation transformer.

A phase plane is formed by the three-phase voltages $\dot{U}_a$, $\dot{U}_b$, $\dot{U}_c$, and one phasor circle ABC is formed by three voltage phasors, and a selection principle of the point K is as follows:

1) when considering device insulation, selecting an arbitrary point in the phase plane formed by the three-phase voltages $\dot{U}_a$, $\dot{U}_b$, $\dot{U}_c$ as the point K;

2) when performing zero-sequence parameter measurement, selecting a phasor circle in the phase plane with an effective value of the measured voltage being a radius, and point K being limited on the phasor circle;

3) when considering insulation safety, if an effective value of each phase-to-ground voltage does not exceed $\sqrt{3}U_\varphi$, forming a circular arc having a radius with an effective value of $\sqrt{3}U_\varphi$ by taking A, B, and C as a center respectively, three circular arcs closing an area, selecting the working point K in this area;

4) considering the phase-to-ground safety voltage, if it is supposed that the phase B-to-ground insulation is damaged but a faulty running time still needs to be extended, selecting the target working point K in the area of 3) and near the point B and appropriately reducing a withstand voltage of phase B relative to ground according to an actual insulation tolerance.

The present disclosure applies a control method based on the virtual ground principle to achieve virtual ground of the point K, and an accurate zero-sequence resonant parameter of a zero-sequence network under an action of the excitation $\dot{U}_{KN}$ can be obtained. When the fault phase is grounded, the specified ground phase is the target working point, and the voltage of this phase relative to ground is 0, so that both the residual voltage and the residual current of the fault phase are effectively suppressed. The accurate measurement scheme can be used for the pre-tuning control of the arc-suppression reactance, and the virtual ground control can be used for the accurate compensation of the inductive current difference, which can reduce the controlled source capacity and save the overall cost of the device. For the virtual ground control devices with full compensation capability, online measurement and partial reactance pre-tuning control are not required.

DESCRIPTION OF EMBODIMENTS

The contents of the present disclosure are explained step by step below:

1) Virtual Ground Principle

Figure 1:
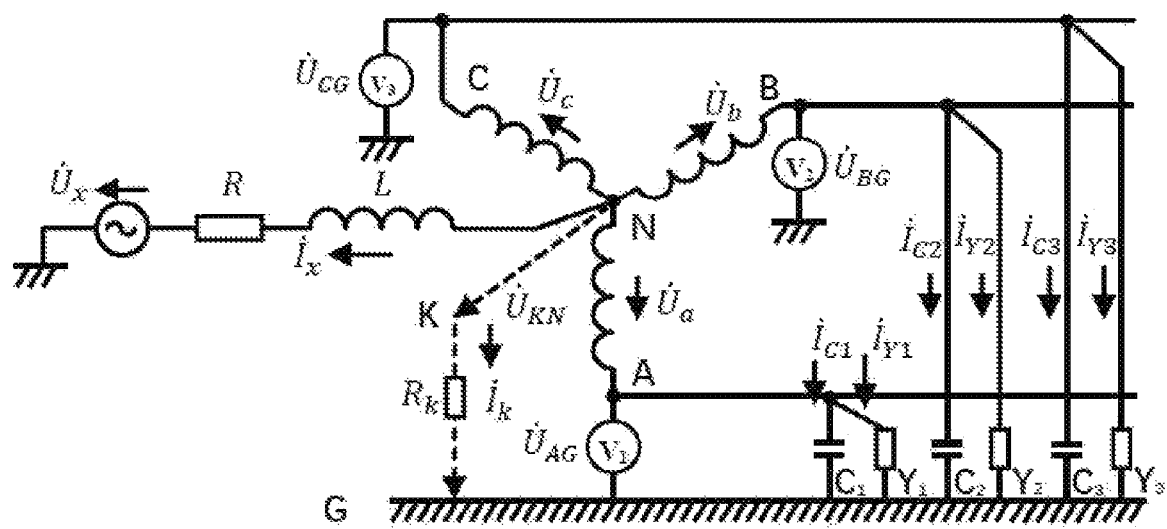
FIG. 1 is a schematic diagram of a three-phase distribution system and a virtual ground.

As shown in FIG. 1, a neutral point N of a main transformer (or a zigzag-shaped ground transformer) is grounded via a series branch of an arc-suppression inductance L, an equivalent resistance R and a controllable inverter source unit $\dot{U}_x$, and the equivalent resistance R is a sum of a coil resistance r and a ground resistance Rg. The bus-to-ground voltages $\dot{U}_{AG}$, $\dot{U}_{BG}$ and $\dot{U}_{CG}$ of three phases are measured by three voltage sensors V1, V2, and V3, respectively, and the analysis parameters and their reference directions are as shown in FIG. 1. The line-to-ground distributed capacitance of the three phases are $C_1$, $C_2$ and $C_3$, respectively, and the conductance-to-ground are $Y_1$, $Y_2$ and $Y_3$, respectively. Then:

$$\dot{I}_a = \dot{I}_{C1}+\dot{I}_{Y1}=(\dot{U}_a-\dot{U}_{GN})(j\omega C_1+Y_1) \quad (1);$$

$$\dot{I}_b = \dot{I}_{C2}+\dot{I}_{Y2}=(\dot{U}_b-\dot{U}_{GN})(j\omega C_2+Y_2) \quad (2);$$

$$\dot{I}_c = \dot{I}_{C3}+\dot{I}_{Y3}=(\dot{U}_c-\dot{U}_{GN})(j\omega C_3+Y_3) \quad (3);$$

$$\dot{I}_x = -(\dot{I}_a+\dot{I}_b+\dot{I}_c) \quad (4).$$

Under symmetrical conditions, the parameters of the three phases relative to ground are balanced, and the capacitance of each phase is $C_\varphi$ and the conductance is $Y_\varphi$. Moreover, the power supplies of the three phases are also completely symmetrical. When an injection source $U_x$ is 0, a neutral point-to-ground voltage $U_{GN}$ is 0, and a current $I_x$ is 0.

Provided that there is an arbitrary point K on a $\dot{U}_{abc}$ phasor plane, and the voltage relative to point N is $\dot{U}_{KN}$. If there is an NKG fault branch in FIG. 1 and there is a ground transition resistance $R_k$, then:

$$\dot{I}_k = (\dot{U}_{KN} - \dot{U}_{GN})/R_k = \dot{U}_{KG}/R_k \tag{5}$$

Equation (5) is a virtual ground equation. In fact, the fault branch does not exist, and $R_k$ is infinite, i.e., open circuit, so that the fault current remains 0.

Equations (2), (3), and (5) are substituted into equation (4), and the phase distributed capacitance $C_\varphi$ and the distributed conductance $Y_\varphi$ are substituted, then:

$$\dot{I}_x = -(\dot{U}_a + \dot{U}_b + \dot{U}^c)(j\omega C_\varphi + Y_\varphi) + 3\dot{U}_{GN}(j\omega C_\varphi + Y_\varphi) - \dot{U}_{KG}/R_k \tag{6}$$

i.e., $$\dot{I}_x \dot{U}_{GN}(j\omega 3C_\varphi + 3Y_\varphi) - \dot{U}_{XG}/R_k \tag{7}$$

Figure 2:
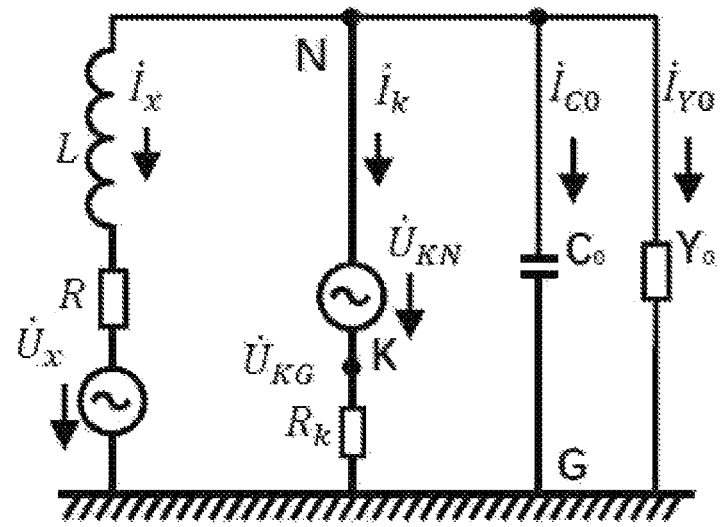
FIG. 2 is an equivalent zero-sequence circuit of a three-phase circuit shown in FIG. 1.

According to the Equation (7), the three-phase circuit shown in FIG. 1 can be equivalent to the zero-sequence circuit shown in FIG. 2, in which the total zero-sequence capacitance $C_0$ is the sum of the distributed capacitance $C_1$, $C_2$, $C_3$, of the three phases, i.e., $3C_\varphi$, and the total zero-sequence conductance $Y_0$ is the sum of the distributed conductance $Y_1$, $Y_2$, $Y_3$, of the three phases, i.e., $3Y_\varphi$.

Considering that the point K-to-ground voltage cannot be measured, the fault phase-to-ground voltage $\dot{U}_{KG}$ is obtained by the following calculation:

$$\dot{U}_{KG} = \dot{U}_{KN} + \dot{U}_{NG} \tag{8}$$

where $\dot{U}_{KN}$ is the set voltage of the virtual working point K, and $\dot{U}_{NG}$ is the neutral point-to-ground voltage.

Figure 3:
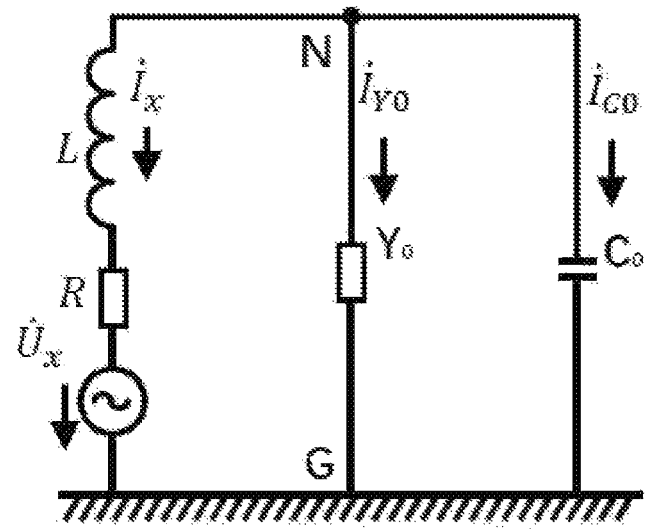
FIG. 3 is an equivalent circuit of the zero-sequence circuit shown in FIG. 2.

Control is applied to the zero-sequence circuit shown in FIG. 2, such that the terminal voltage $\dot{U}_{GN}$ of the controlled arc-suppression ground branch is exactly equal to the voltage $\dot{U}_{KN}$ of the virtual working point K. The condition that the fault ground branch current $\dot{I}_k$ is 0 can be satisfied, and $R_k$ is open, and the point K-to-ground voltage $\dot{U}_{KG}$ is 0. Then, the zero-sequence circuit can also be equivalent to the simple circuit shown in FIG. 3. At this time, Equation (7) is:

$$\dot{I}_x = \dot{U}_{KN}(j\omega 3C_\varphi + 3Y_\varphi) \tag{9}$$

The injection current $\dot{I}_x$ of the neutral point-controlled injection branch is:

$$\dot{I}_x = (\dot{U}_x - \dot{U}_{KN})/(R + j\omega L) \tag{10}$$

It can be obtained from Equation (9) and Equation (10) that:

$$\dot{U}_x = [1 + (R + j\omega L)(j\omega C_0 + Y_0)]\dot{U}_{KN} \tag{11}$$

The fraction $L_0/m$ of the standard arc-suppression reactance $L_0$ is taken as the injection branch reactance L, and $L_0, C_0$ meet the resonant condition:

$$\omega^2 L_0 C_0 = 1 \tag{12}$$

The fractional reactance value and the resonant condition are substituted into equation (11), then:

$$\dot{U}_x = \left(1 - \frac{1}{m}\right)\dot{U}_{KN} + j\omega C_0 R \dot{U}_{KN} + (R + j\omega L)Y_0 \dot{U}_{KN}. \tag{13}$$

Equation (13) is the controlled condition of the equivalent ideal reactance in the zero-sequence circuit and can be divided into three terms: the last term is a negative conductance voltage component for cancelling the line distributed conductance $Y_0$; the middle term is a negative resistance voltage component for canceling the total resistance R of the arc-suppression injection branch; the first term is the equivalent voltage component of the partial reactance to the full reactance. Moreover, when injecting the three-phase distribution system shown in FIG. 1, the equivalent reactance value is continuously adjustable between capacitive and inductive. Equation (13) satisfies the resonant condition when and only when the residual voltage is 0.

If the line conductance is 0, the last term is 0; if the total resistance of the injection branch R is 0, the middle term is 0; if the full reactance is taken and m is 1, the first term is 0. When the three conditions are satisfied at the same time, the controlled source $\dot{U}_x$ takes a value of 0, and the zero-sequence circuit degenerates into a pure inductance and capacitance circuit.

When the conventional resonant ground system is single-phase grounded, the zero-sequence circuit is induced with the LC oscillation by the fault resistance $R_K$ under excitation of the fault phase voltage, and the oscillation terminal voltage converges to the fault phase voltage; under the virtual ground condition, the zero-sequence circuit is induced with the LC oscillation by the injection branch, and the terminal voltage is the virtual working point voltage $\dot{U}_{KN}$.

In the actual project, usually none of these three conditions is satisfied, but as long as values of the effective value and phase of the controlled source $\dot{U}_x$ are taken in accordance with Equation (13), the three-phase circuit shown in FIG. 1 can obtain accurate resonant conditions such that the residual voltage of the virtual ground point K-to-ground is 0. Similarly, if there is such a control method that the residual voltage of the virtual ground point K-to-ground is 0, then the controlled source $\dot{U}_x$ must satisfy the condition of Equation (13), and the circuit is in an accurate resonant state.

It can be obtained from Equation (7) that:

$$\dot{I}_x = (\dot{U}_x - \dot{U}_{GN})/(R + j\omega L) = \dot{U}_{GN}(j\omega C_0 + Y_0) - (\dot{U}_{KN} - \dot{U}_{GN})/R_k \tag{14}$$

$$\dot{U}_x = \dot{U}_{GN} + (R + j\omega L)(j\omega C_0 + Y_0)\dot{U}_{GN} - \dot{U}_{KG}(R + j\omega L)/R_k \tag{15}$$

$$\dot{U}_x = \dot{U}_{GN} - (R + j\omega L)(\dot{I}_{C0} + \dot{I}_{Y0}) - \dot{U}_{KG}(R + j\omega L)/R_k \tag{16}$$

where each parameter takes the reference direction shown in FIG. 2.

Figure 4:
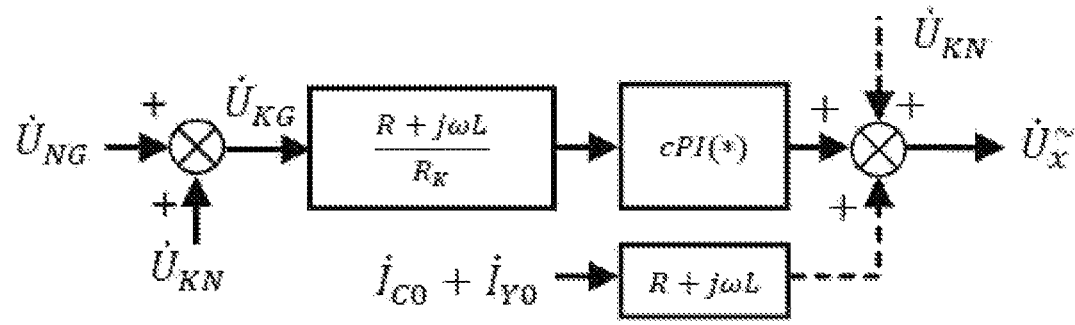
FIG. 4 is a negative feedback control loop.

According to the Equation (16), the present disclosure proposes the following scheme: taking the virtual working point-to-ground voltage $\dot{U}_{KG}$ as an input and taking the ground-to-neutral point voltage $\dot{U}_{GN}$ and the voltage drop of the system zero-sequence network current on the injection branch as corrections to construct a negative feedback control loop as shown in FIG. 4, taking the appropriate complex phasor proportional integral parameter $cPI[K_p + K_i/s]$ so as to cause the zero-sequence circuit to enter into an LC parallel resonant state, the loop circuit input $U_{KG}$ converging to 0, and the fault branch current $I_k$ being also zero. In addition, PI control calculation is applied to both the real part and the imaginary part of the input complex phasor. The governing equation is as follows:

$$\dot{U}_x = \dot{U}_{GN} + (R + j\omega L)(\dot{I}_{C0} + \dot{I}_{Y0}) + cPI[\dot{U}_{KG}(R + j\omega L)/R_k] \tag{17}$$

where the complex phasor proportional integral term is:

$$cPI[a + jb] = a(Kp + Ki/s) + jb(Kp + Ki/s) \tag{18}$$

In Equation (17), the line zero-sequence total current $İ_{C0}+İ_{Y0}$ is a complex constant under the condition of resonance convergence, and the measured value is affected by the convergence process of the ground voltage $Ü_{KG}$. If the ground voltage $Ü_{KG}$ reliably converges, this term can take the complex constant with a deviation, or even be ignored, and be compensated by the cPI part; the $Ü_{GN}$ term belongs to a complex constant which has a bounded amplitude and converges to the set voltage $Ü_{KN}$, and it can also be ignored and compensated by the cPI part. Therefore, it is indicated by a broken line in FIG. 4 and can be partially or completely cancelled.

In Equation (17), the impedance ratio $(R+j\omega L)/R_k$ of the injection branch to the fault ground branch includes an unknown impedance $R_k$, which will cause the cPI gain to change in the case of an actual ground fault, and it is open circuit and can be set to a constant in the case of virtual ground. Thus, a simple governing expression (19) can be obtained:

$$Ü_x = cPI[Ü_{KG}] \quad (19)$$

Figure 5:
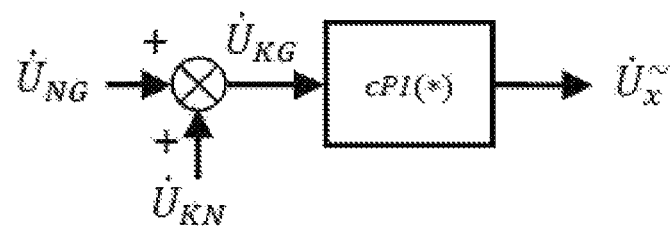
FIG. 5 is a simplified control block diagram of the present disclosure.

From the control Equation (19), the simplest control block diagram shown in FIG. 5 can be constructed.

The stability of the control system is examined by Equations (15) and (19) with $R_k$ being open:

$$[1+(R+j\omega L)(j\omega C_0+Y_0)](Ü_{KN}-Ü_{KG})-cPI[Ü_{KG}]=0 \quad (20)$$

its s-domain equation is:

$$[1+(R+sL)(sC_0+Y_0)](Ü_{XN}-Ü_{XG})-\left(K_p+\frac{K_i}{s}\right)Ü_{KG}=0 \quad (21)$$

$$Ü_{KG} = \frac{s[1+(R+sL)(sC_0+Y_0)]}{s^3LC_0+s^2(LY_0+RC_0)+s(RY_0+1+K_p)+K_i} Ü_{KN} \quad (22)$$

The characteristic equation of the control system is:

$$s^3LC_0+s^2(RC_0+LY_0)+s(RY_0+1+K_p)+K_i=0 \quad (23)$$

A resonant ground system having an actual capacity of 150 A is considered: approximately taking 3 phase-to-ground capacitors of 28 μF, with $C_0$ being 84 μF; taking a resonant connection inductance L as 15 mH; taking $Y_0$ as 3 times of single-phase conductance of 1 μS, i.e., 3 μS; taking R as 4Ω; taking $R_K$ as 1Ω, which does not work in the case of virtual ground.

From the actual parameter analysis, the characteristic equation (23) has three roots: $-12.53+j0, -127.09\pm j1252.19$, all of which stably converge.

2) Simulation Verification of Single Point Virtual Ground Convergence Based on a Virtual Ground Control Method A simulation system is constructed based on the above system parameters, and one voltage phasor $Ü_{KN}$ is arbitrarily specified, and $Ü_{KG}$ reliably converges to 0. The specified voltage phasor can be independent of the tolerance of the system insulation and a fault branch is not required.

3) Simulation Verification of Zero-Sequence Parameter Measurement Based on Virtual Ground Control Method The voltage phasor $Ü_{KN}$ is set to 100+j0(V), and a virtual ground control is applied, such that $Ü_{KG}$ reliably converges to 0, and the measured injection current is 0.0419+j2.6385 (A). Namely, when the LC resonant terminal voltage of the zero-sequence circuit is 100V, the injection capacitive current component is 2.6385 A, the corresponding zero-sequence capacitance value is 83.986 μF, the set value is 84 μF, and the deviation is −0.166‰. When simulating with different zero-sequence parameters and control parameters, the calculated values of the zero-sequence capacitance constantly have higher precision. The active component of the current is affected by the line's own resistance and the conductance relative to ground, but since both are distributed parameters, the respective accurate measurements are not discussed here. In particular, if the conductance relative to ground has a delta of variation, there can still be accurate calculation results when described in terms of lumped parameters. It can be known that the virtual ground point-to-ground maintains a residual voltage of 0, and the injection branch can exhibit a negative conductance effect, such that accurate LC oscillation conditions are obtained between the equivalent inductance and the capacitance relative to ground of the injection branch, and the zero-sequence capacitance parameters can be calculated with sufficient accuracy from the capacitive component of the injection current.

Figure 6:
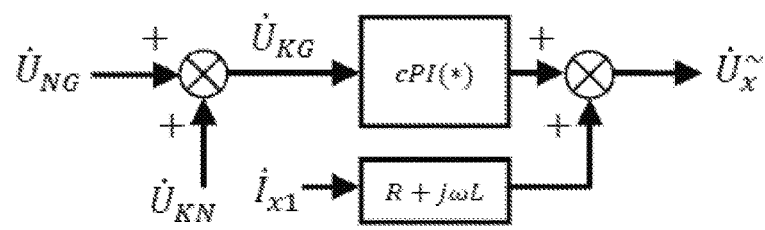
FIG. 6 illustrates a simulated fault branch current curve using a system of 10 kV and a compensation current of 150 A.
Figure 7:
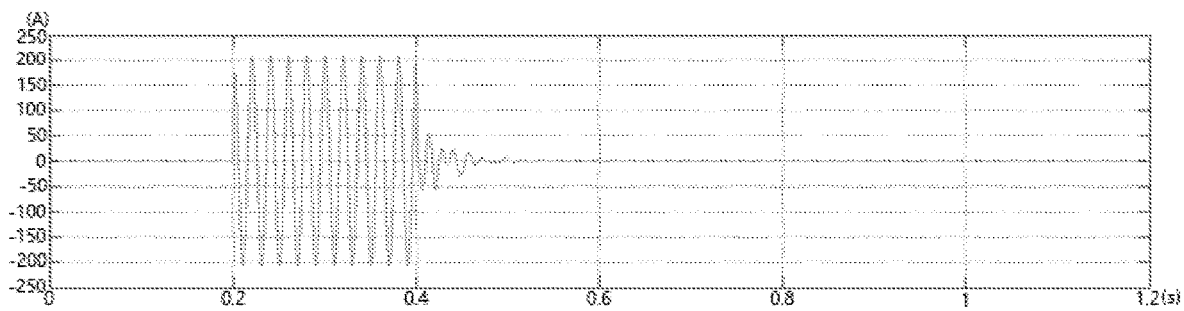
FIG. 7 illustrates details of a convergence process.

4) Simulation Verification of Single-Phase Being Grounded Via Transition Resistance Based on Virtual Ground Control Method In particular, phase A is specified as the actual ground point, and $R_k$ is grounded at 10Ω, 100Ω, 1000Ω, 10000Ω, or even being not grounded, such that, following the simulation system described above, the results all reliably converge, i.e., the fault phase-to-ground voltage converges to 0. Simulation results: FIG. 6 illustrates a simulated fault branch current curve using a system of 10 kV and a compensation current of 150 A, with a single-phase ground fault occurring in the phase A line at 0.2 second, the ground resistance being 10Ω, the control system starting at 0.4 second and basically converging at about 0.5 second. FIG. 7 illustrates the details of the convergence process.

5) Test Verification of Single-Phase Ground Fault Based on Virtual Ground Control Method Test results: in two resonant ground test systems respectively having a line voltage of 173V and an arc-suppression capacity of 100V5 A/500VA and having a line voltage of 400V and an arc-suppression capacity of 230V45 A/10 kVA, the same conclusion is obtained using the virtual ground control method. The convergence transition time is 3 to 5 power frequency cycles. When calculating according to the nominal value of the capacitor, the inductive current compensation deviation at resonance is about 5‰, and the residual voltage reading of the power frequency voltmeter is 0V in the case of the single-phase ground, and the control system outputs about 50 mV in real time.

6) Advantages of Virtual Ground Control Method

The virtual ground control method merges problems such as the zero residual pressure convergence target, the accurate resonant condition setting, the compensation of the active component into one control system in order to form a comprehensive control scheme through proper closed-loop feedback control, so that several problems can be solved at the same time, whereas the single-phase ground fault, neutral-point flexible clamp operations, etc. are a set of special cases of virtual ground. It is especially important that the measurement of the fault phase (including the virtual fault point)-to-ground voltage belongs to a 0-voltage measurement, and the input difference can be 0 using the closed-loop control of direct residual voltage input. However, in an actual system, the voltage of each phase-to-ground is directly measured, and the zero-detection accuracy of the voltage sensor used is much higher than the non-zero measurement accuracy, which is more conducive to the effective suppression of control deviation and has a better suppression effect on the actual residual voltage and the residual current.

Figure 8:
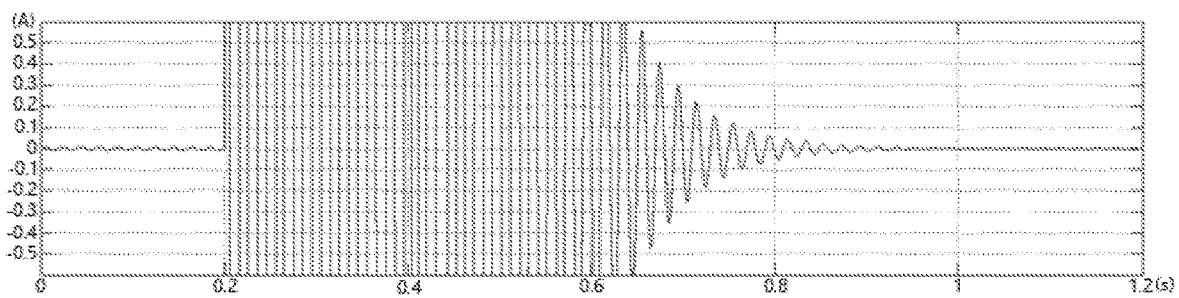
FIG. 8 is a control scheme when a partial inductive current is supplied by using an existing arc-suppression coil X1.

7) Using a Scheme for Injecting a Compensation Current with the Controlled Source and the Reactance being Parallel When a partial inductive current is supplied by the existing arc-suppression coil X1, the present disclosure proposes the control scheme in FIG. 8, where $\dot{I}_{x1}$ is a preset reactance current, which can be a measured current under the action of $\dot{U}_{GN}$ and can also approximately adopt a real-time calculated current under the action of the fault point voltage $\dot{U}_{KN}$ without affecting the system convergence.

8) Selection Limitation on Virtual Ground Working Point

Figure 9:
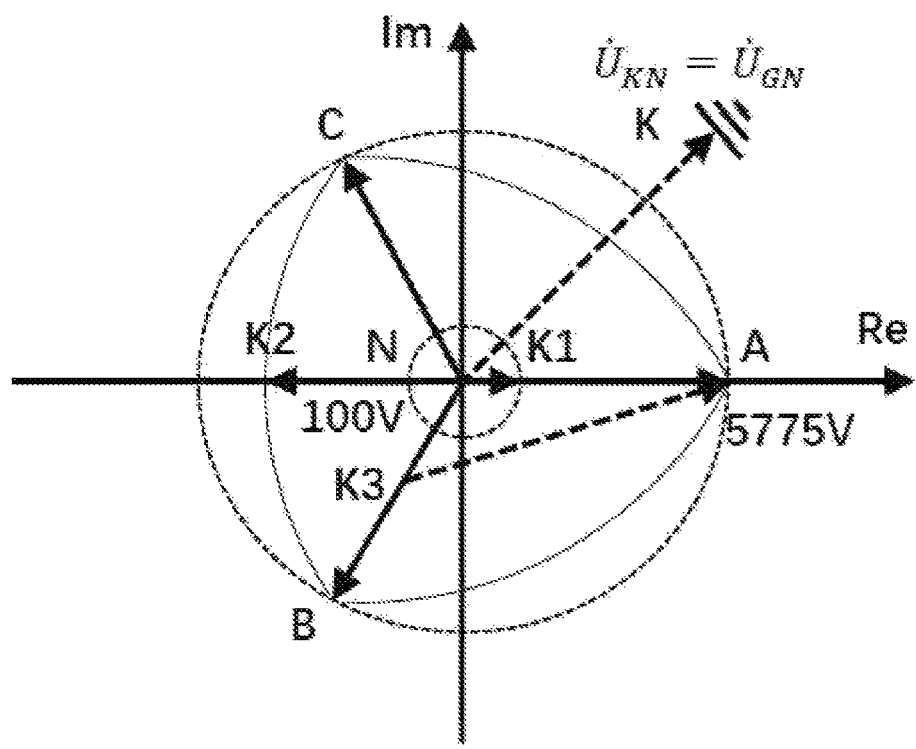
FIG. 9 is a schematic diagram of a selection range of a virtual ground working point.

As shown in FIG. 9, a Re+jIm phase plane is formed by the three-phase voltages $\dot{U}_a$, $\dot{U}_b$, $\dot{U}_c$, and one phasor circle ABC is formed by the three voltage phasors having a radius with an effective value being 5775V. When the device insulation is not counted, the point K can be arbitrarily selected in the phase plane, and the K point is equivalently grounded by the virtual ground method. The distribution system has physical ground points only when A, B, C, and N are selected: any phase bus of A, B, and C, or a neutral point N.

When used as a measurement in the above 3), a small phasor circle, such as the 100V phasor circle in FIG. 9, can be set, and the preset phasor $\dot{U}_{KN}$ is defined on the circle, such that a zero-sequence resonance measurement with an effective value of 100V can be performed. After convergence of the point K-to-ground, the offset of the three phases relative to ground is not large, which does not affect the normal operation of the system. The point K1 in FIG. 9 is the same phase voltage of A, and the effective value is 100V. In actual use, measuring the magnitude of the effective value can be adjusted as needed, and the injection capacity satisfies the $U^2/Z$ relationship and contains a small proportion of the active component.

When considering insulation safety, if the effective value of each phase-to-ground voltage does not exceed $\sqrt{3}U_\varphi$, a circular arc having a radius with the effective value of $\sqrt{3}U_\varphi$ can be formed by respectively taking A, B, and C as the center, and the three circular arcs close an area. Setting the working point K in this area can achieve that the limit of the insulation voltage of each phase-to-ground is not broken. If it is necessary to detect the insulation tolerance of the phase A, the phase voltage direction opposite to the phase A can be selected. For example, when setting according to the K2 direction in FIG. 9, the phase A-to-ground voltage can appropriately increase, and the voltages of the phases B and C relative to ground will decrease, so that the insulation tolerance of the phase A can be tested.

When further considering the phase-to-ground safety voltage, if it is supposed that the phase B-to-ground insulation is damaged but the faulty running time still needs to be extended, the target working point K3 can be selected in this area and near the point B and the withstand voltage of phase B relative to ground is appropriately reduced according to the actual insulation tolerance, and even operating by being grounded. However, the voltages of phases A and C relative to ground will increase correspondingly and will not break the insulation voltage limit.

8) Description of the Implementation of Virtual Ground Control Method

The control scheme proposed by the present disclosure is a scheme in which a controlled voltage source is injected into a system neutral point via reactance, which, in essence, is a current injection behavior. The connection reactance L has a certain leveling effect on the system voltage disturbance and the controlled source voltage disturbance, which is superior to the rigid voltage clamping manner. In the injection manner, the injection can be performed in a direct-hanging mode in which the compensation current is directly injected into the neutral point, and it is also possible to use an isolation transformer to inject a compensation current into the neutral point. Whether or not an isolation transformer is used has no essential impact on this control scheme.

When there is a potential oscillation overvoltage factor in the system, point N clamping can be considered, or a limited offset voltage is applied, so as to make the system operate stably in a low-voltage resonant clamping state, which helps to suppress system oscillation.

The theoretical basis on which the present disclosure relies is reliable, and the control method is very simple, which expands the existing zero-sequence measurement and arc-suppression theory, has excellent performance in many aspects such as measurement, accurate resonance control, residual pressure suppression and the like, can be further broadened to applications such as insulation exploration without providing the measurement part, and thus is a unified control scheme with universal applicability. Both simulation and experimentation show that when there is a certain degree of asymmetry in the power distribution network, the system can still work stably. This is an ideal measurement and control scheme for the single-phase ground fault in resonant ground systems.

Similar control schemes obviously constructed by the scheme proposed by the present disclosure, whose fundamental properties have not changed significantly, are also within the scope of the present disclosure.

What is claimed is:

1. A zero-sequence parameter measurement and ground voltage control method for a resonant ground system based on a virtual ground principle, the method comprising:

achieving a virtual ground at a point K by using a ground point voltage zeroing control approach, wherein the point K is an arbitrary point in a plane consisting of three-phase voltage phasors;

obtaining an accurate zero-sequence resonant parameter of a zero-sequence network under an action of excitation of a voltage relative to a neutral point;

setting a ground phase as a target working point when a fault phase is grounded; and applying the ground point voltage zeroing control approach to make the zero-sequence network in an accurate resonate state based on the accurate zero-sequence resonant parameter, so as to effectively suppress both a residual voltage and a residual current of the fault phase, wherein in the accurate resonate state, a phase-to-ground voltage is 0.

2. The zero-sequence parameter measurement and ground voltage control method for a resonant ground system based on a virtual ground principle according to claim 1, wherein the ground point voltage zeroing control approach is as follows:

using a conventional resonant ground manner, the neutral point being grounded via a series branch of an arc-suppression inductance, an equivalent resistance and a controllable inverter source unit; and dividing a standard arc-suppression reactance into m parts and one of the m parts being an injection branch reactance, the standard arc-suppression reactance and a total zero-sequence capacitance satisfying a resonant condition:

$$\omega^2 L_0 C_0 = 1$$

-continued then:

$$\dot{U}_x = \left(1 - \frac{1}{m}\right)\dot{U}_{KN} + j\omega C_0 R \dot{U}_{KN} + (R + j\omega L)Y_0 \dot{U}_{KN}$$

Wherein $\dot{U}_x$ is a voltage of the controllable inverter source unit, L is an inductance value of the arc-suppression inductance, R is an resistance value of the equivalent resistance, $L_0$ is a reactance value of the standard arc-suppression reactance, $\dot{U}_{KN}$ is a voltage of the specified point K relative to the neutral point N, $C_0$ is a total zero-sequence capacitance and is a sum of a distributed capacitance of three phases, $Y_0$ is a total zero-sequence conductance and is a sum of a distributed conductance of the three phases, and ω is a power frequency angular frequency of a power distribution network;

taking a virtual working point K-to-ground voltage $\dot{U}_{KG}$ as an input and taking a ground-to-neutral point N voltage $\dot{U}_{GN}$ and a voltage drop of the system zero-sequence network current on the injection branch as corrections to construct a negative feedback control loop, taking an appropriate complex phasor proportional integral parameter $cPI[K_p + K_i/s]$, and causing the zero-sequence circuit to enter into an LC parallel resonant state, a loop circuit input $U_{KG}$ converging to 0, PI control calculation being applied to both a real part and an imaginary part of an input complex phasor, a governing equation being as follows:

$$\dot{U}_x = \dot{U}_{GN} + (R+j\omega L)(\dot{I}_{C0}+\dot{I}_{Y0}) + cPI[\dot{U}_{KG}(R+j\omega L)/R_k]$$

wherein a complex phasor proportional integral part is:

$$cPI[a+jb] = a(Kp+Ki/s) + jb(Kp+Ki/s)$$

Where $\dot{U}_x$ is a control voltage value of the controllable inverter source unit, $\dot{U}_{GN}$ is a ground-to-neutral point voltage, $R_K$ is a virtual working point-to-ground transition resistance, and $\dot{I}_{C0}+\dot{I}_{Y0}$ is a line zero-sequence total current and is a complex constant under a resonance convergence condition.

3. The zero-sequence parameter measurement and ground voltage control method for a resonant ground system based on a virtual ground principle according to claim 2, wherein two parameters of the line zero-sequence total current $\dot{I}_{C0}+\dot{I}_{Y0}$ and an impedance $R_k$ are ignored, and the governing equation is simplified as:

$$\dot{U}_{\tilde{x}} = cPI[\dot{U}_{KG}].$$

4. The zero-sequence parameter measurement and ground voltage control method for a resonant ground system based on a virtual ground principle according to claim 2, wherein in the method, when a controlled voltage source is injected into the neutral point of the system via the reactance, the injection can be performed in a direct-hanging mode, i.e., a compensation inductive current is injected directly into the neutral point, or a compensation current is injected into the neutral point by using an isolation transformer.

5. The zero-sequence parameter measurement and ground voltage control method for a resonant ground system based on a virtual ground principle according to claim 2, wherein a phase plane is formed by the three-phase voltages $\dot{U}_a$, $\dot{U}_b$, $\dot{U}_c$, and one phasor circle is formed by a first voltage phasor for an A phase, a second voltage phasor for a B phase and a third voltage phasor for a C phase, and a selection principle of the point K is as follows:

1) when unconsidering device insulation, selecting an arbitrary point in the phase plane formed by the three-phase voltages $\dot{U}_a$, $\dot{U}_b$, $\dot{U}_c$ as the point K;
2) when performing zero-sequence parameter measurement, selecting a phasor circle in the phase plane with an effective value of the measured voltage being a radius, and point K being limited on the phasor circle;
3) when considering insulation safety, if an effective value of each phase-to-ground voltage does not exceed $\sqrt{3}U_{100}$, forming a circular arc having a radius with an effective value of $\sqrt{3}U_{100}$ by taking the first voltage phasor, the second voltage phasor, and the third voltage phasor as centers respectively, three circular arcs closing an area, selecting the working point K in this area; and
4) considering a phase-to-ground safety voltage, if it is supposed that phase B-to-ground insulation is damaged but a faulty running time still needs to be extended, selecting the target working point K in the area of 3) and near the second voltage phasor, and appropriately reducing a withstand voltage of phase B relative to ground according to an actual insulation tolerance.

* * * * *